United States Patent
Lee et al.

(10) Patent No.: US 6,753,448 B2
(45) Date of Patent: Jun. 22, 2004

(54) PHOTORESIST MONOMERS, POLYMERS THEREOF AND PHOTORESIST COMPOSITIONS USING THE SAME

(75) Inventors: Geun Su Lee, Ichon-shi (KR); Jae Chang Jung, Ichon-shi (KR); Ki Ho Baik, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 10/330,869

(22) Filed: Dec. 26, 2002

(65) Prior Publication Data

US 2003/0144567 A1 Jul. 31, 2003

Related U.S. Application Data

(62) Division of application No. 09/630,620, filed on Aug. 2, 2000, now Pat. No. 6,573,012.

(30) Foreign Application Priority Data

| Aug. 6, 1999 | (KR) | 1999-32240 |
| Aug. 6, 1999 | (KR) | 1999-32241 |
| Aug. 6, 1999 | (KR) | 1999-32242 |

(51) Int. Cl.$^7$ .................. C07C 49/205; C07C 49/547; C07C 49/557; G03F 7/004
(52) U.S. Cl. ............. 568/374; 568/375; 585/22; 430/270.1; 430/905
(58) Field of Search ............ 430/270.1; 568/374, 568/375; 585/22

(56) References Cited

U.S. PATENT DOCUMENTS

| 4,271,460 A | * | 6/1981 | Baker ............... 363/49 |
| 4,728,747 A | * | 3/1988 | Hoffmann et al. ........ 558/428 |
| 5,730,960 A | * | 3/1998 | Stein et al. ............ 424/59 |
| 6,111,144 A | * | 8/2000 | Holton et al. ........... 568/361 |
| 6,184,419 B1 | * | 2/2001 | Berg-Schultz et al. ...... 568/374 |

* cited by examiner

Primary Examiner—John S. Chu
(74) Attorney, Agent, or Firm—Townsend and Townsend and Crew LLP

(57) ABSTRACT

The present invention provides compounds represented by formulas 1a and 1b'; and photoresist polymers derived from the same. The present inventors have found that photoresist polymers derived from compounds of formulas 1a, 1b, or mixtures thereof, having an acid labile protecting group have excellent durability, etching resistance, reproducibility, adhesiveness and resolution, and as a result are suitable for lithography processes using deep ultraviolet light sources such as KrF, ArF, VUV, EUV, electron-beam, and X-ray, which can be applied to the formation of the ultrafine pattern of 4G and 16G DRAMs as well as the DRAM below 1G:

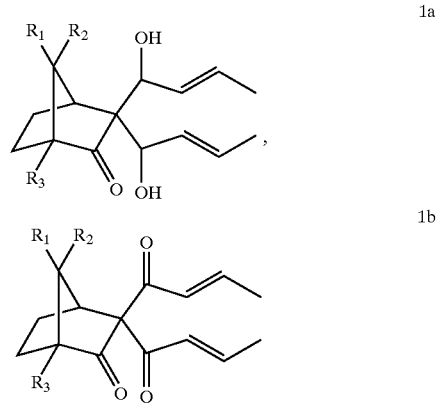

where $R_1$, $R_2$ and $R_3$ are those defined herein.

2 Claims, 4 Drawing Sheets

US 6,753,448 B2

PHOTORESIST MONOMERS, POLYMERS THEREOF AND PHOTORESIST COMPOSITIONS USING THE SAME

This application is a division of Ser. No. 09/630,620 filed Aug. 2, 2000 now U.S. Pat. No. 6,573,012.

BACKGROUND OF THE INVENTION

1. Field of the Invention

The present invention relates to photoresist monomers, polymers derived from the same and photoresist compositions comprising the polymers. In particular, the present invention relates to norcamphor or camphor derivative photoresist monomers, polymers derived from the same, and photoresist compositions comprising the polymers that are suitable for photolithography processes employing KrF, ArF, EUV, VUV and similar light sources.

2. Description of the Background Art

Recently, chemical amplification-type DUV photoresists have been investigated to increase sensitivity in minute image formation processes for preparing semiconductor devices. Such photoresists are prepared by blending a photoacid generator and matrix resin polymer (i.e., photoresist polymer) comprising an acid labile group.

In a photolithography process, an exposure of photoresist to light of a particular wavelength generates an acid from the photoacid generator that is present in the photoresist. This acid causes the main chain or the branched chain of the resin to decompose or become cross-linked. In addition, the acid removes the acid labile group and changes the polarity of the photoresist in the exposed region. This polarity change creates a solubility difference between the exposed portion and the unexposed portion in a developing solution, thereby allowing a pattern formation. The resolution of the pattern that is formed depends on the wavelength of the light source—i.e., in general, a shorter wavelength allows formation of more minute patterns.

In general, a useful photoresist (hereinafter, abbreviated as "PR") has a variety of desired characteristics, such as excellent etching resistance, heat resistance and adhesiveness. In addition, a photoresist should be easily developable in a commercially readily available developing solution, such as 2.38 wt % or 2.6 wt % aqueous tetramethylammonium hydroxide (TMAH) solution. However, it is very difficult to synthesize a photoresist polymer that satisfies all of these requisites.

A resin (i.e., photoresist polymer) like novolac resin having high transparency and high etching resistance at the wavelength of 193 nm has been investigated. In addition, researchers at the Bell Research Center have investigates improving the etching resistance by increasing the alicyclic units in the polymer backbone of the resin. Furthermore, Fujitsu and Sipri have studied the effect of adding methacrylate and/or acrylate monomers to improve the etching resistance. Unfortunately, the resulting polymers do not have satisfactory etching resistance. Moreover, the cost of producing polymers having increased alicyclic units in the polymer backbone is significantly higher. Furthermore, many photoresist polymers generally have low adhesiveness; therefore, the dense L/S pattern below 150 nm may collapse.

Recently, in an attempt to overcome some of the above-described disadvantages, Frechet et al. have prepared poly (spiro norbornane) having the following structure:

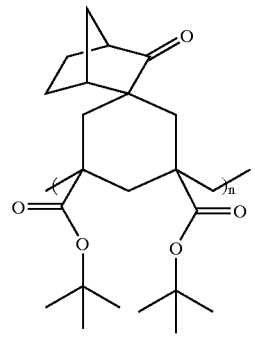

Frechet et al., SPIE, Vol. 3333, 83, 1998. However, the poly(spiro norbornane) provides a resolution of only about 180 nm, and thus is not suitable for forming a minute pattern of high density.

The present inventors have found that adhesiveness of the resist (i.e., photoresist polymer) to a silicon wafer can be enhanced by introducing hydroxyl groups to the photoresist polymer. Furthermore, the present inventors have found that the solubility of such photoresist polymer in a developing solution can be easily adjusted by changing the amount of acid labile protecting groups in the photoresist polymer.

SUMMARY OF THE INVENTION

Accordingly, it is an object of the present invention to provide novel photoresist monomers having the excellent etching resistance, reproducibility, durability, adhesiveness and resolution.

Another objective of the present invention is to provide photoresist polymers derived from such photoresist monomers.

Yet another objective of the present is to provide photoresist compositions comprising such photoresist polymers.

DETAILED DESCRIPTION OF THE PERFERRED EMBODIMENTS

Figure 1:
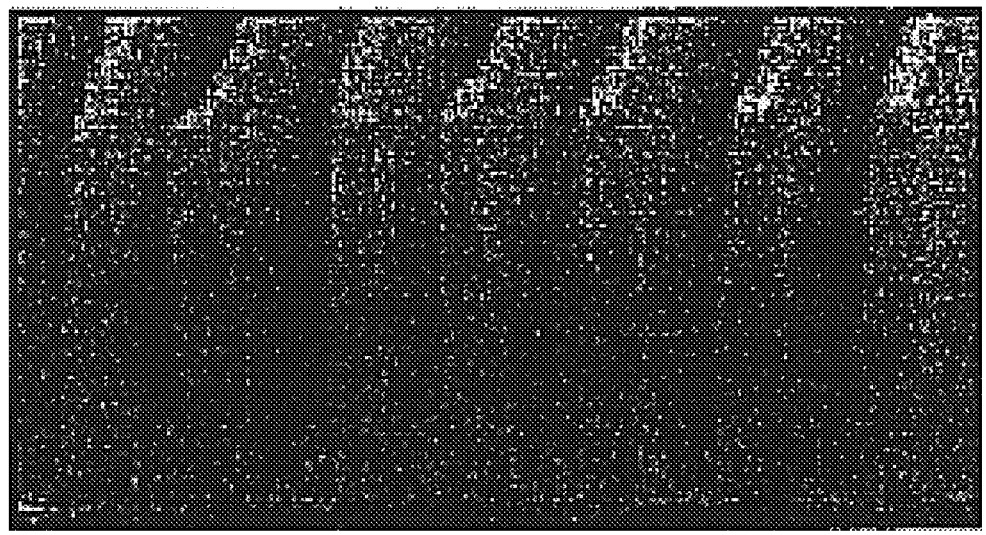
FIG. 1 shows a photoresist pattern obtained in Example 45.

The present invention provides novel photoresist monomers, which achieve the above stated objectives, and a process for producing the same. The present invention also provides photoresist polymers derived from such photoresist monomers, and photoresist compositions comprising such photoresist polymers. The present invention also provides a semiconductor device fabricated by using such photoresist compositions.

In one aspect of the present invention provides a photoresist monomer selected from the group consisting of dihydroxy compounds of the formula:

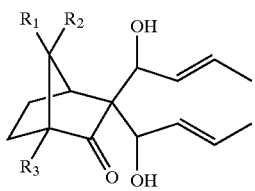

and tricarbonyl compounds of the formula:

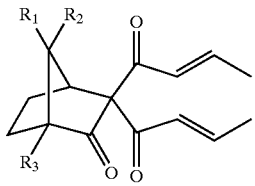

wherein, each of $R_1$, $R_2$ and $R_3$ is independently H, or substituted or unsubstituted linear or branched ($C_1$–$C_4$) alkyl.

Preferably, the compound of formula 1a of the formula:

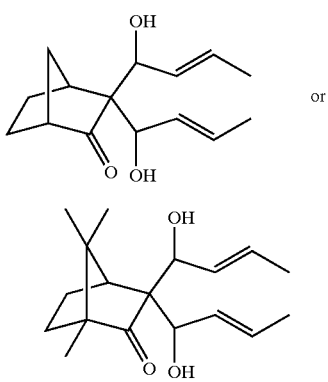

Preferably, the compound of formula 1b is of the formula:

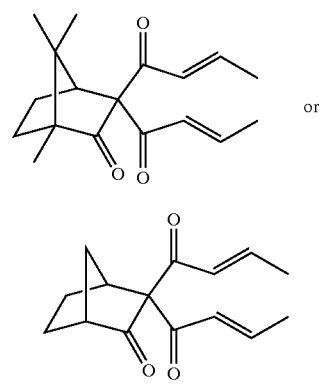

While the above disclosed compounds can be prepared by a variety of methods known to one of ordinary skill in the art, one particular embodiment of the present invention provides a process for producing the compound of formula 1a or 1b comprising the steps of reacting a compound of the formula:

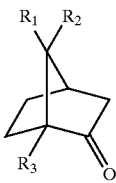

with crotonaldehyde or crotonic anhydride, where $R_1$, $R_2$ and $R_3$ are those described above.

In particular, the compound of formula 1a can be prepared by the process comprising the steps of:

(a) reacting the compound of formula 2 with crotonaldehyde (i.e., compound of the formula: $CH_3CH=CHCHO$) in the presence of a base under conditions sufficient to produce a monoalkylated compound of formula:

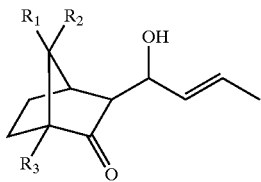

and (b) reacting the monoalkylated compound of formula 4 with crotonaldehyde in the presence of a second base to produce the compound of formula 1a, where, $R_1$, $R_2$ and $R_3$ are those described above. Preferably, the base in the step (a) and the step (b) is identical.

In another embodiment of the present invention, the compound of formula 1b can be prepared by reacting the compound of formula 2 with crotonic anhydride of the formula:

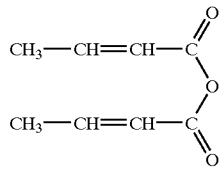

in the presence of a base under conditions sufficient to produce the tricarbonyl compound of formula 1b.

Preferably, the compound of formula 2 is norcamphor of the formula 2a:

or camphor of the formula 2b:

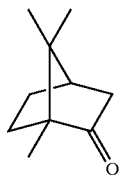
2b

Exemplary bases which are useful in the above process includes n-BuLi, NaHMDS, NaNH$_2$, LDA and t-BuLi.

The present invention also provides a photoresist polymer comprising polymeric units selected from the group consisting of dihydroxy carbonyl polymeric units of the formula:

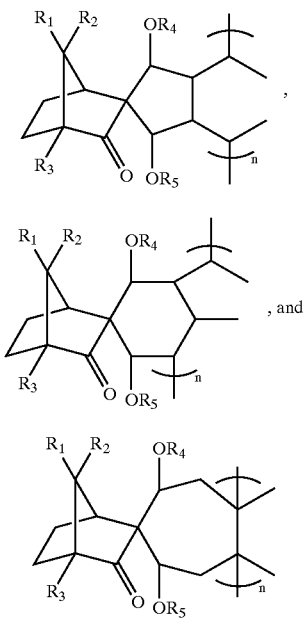

6a

6b

6c trihydroxy polymeric units of the formula:

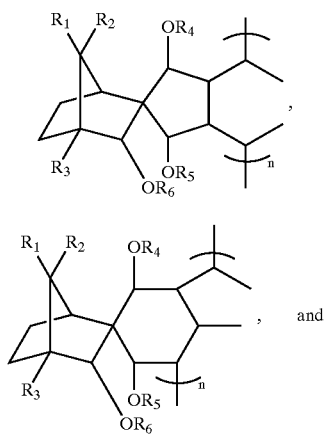

6d

6e

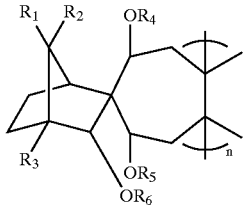

6f and mixtures thereof,
where
n is an integer from about 1 to about 200;
R$_1$, R$_2$ and R$_3$ are those described above; and
each of R$_4$, R$_5$ and R$_6$ is independently H or an acid labile protecting group. Preferably, at least a portion of R$_4$, R$_5$, R$_6$, or mixtures thereof is an acid labile protecting group. As used herein, the term "mixtures thereof" in reference to polymeric units of formulas 6a–6f refers to a mixture of any combination of the dihydroxy carbonyl polymeric units and/or trihydroxy polymeric units.

Preferably, the acid labile protecting group is selected from the group consisting of tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl, tert-butoxycarbonyl, and 2-acetylmenth-1-en-1-yl.

In addition, photoresist polymers of the present invention can also comprise one or more groups selected from the polymeric units derived from norbornylene and maleic anhydride.

Photoresist polymers of formulas 6a–6f or mixture thereof can be prepared by polymerizing the compound of formula 1a or 1b and, where necessary, subsequently carrying out appropriate reactions to produce the photoresist polymers.

Preferably, at least a portion of R$_4$, R$_5$, or mixtures thereof in the compounds of formulas 6a–6f is an acid labile protecting group. Preferably, the amount of the acid labile protecting group in R$_4$, R$_5$, or mixtures thereof present in compounds of formulas 6a–6b is in the range of from about 10% to about 90%.

Photoresist polymers of the present invention can be prepared by a variety methods. In one particular embodiment of the present invention, a process for producing the dihydroxy photoresist polymeric units 6a, 6b, or 6c includes the steps of polymerizing the dihydroxy photoresist monomer of formula 1a to produce the dihydroxy photoresist polymeric units of the formula 6a, 6b or 6c, where R$_4$ and R$_5$ are H. The process can further include the steps of reacting the dihydroxy photoresist polymeric units with a protecting group precursor to convert at least a portion of R$_4$, R$_5$, or mixtures thereof which is H to an acid labile protecting group.

In one particular method of preparing the photoresist polymer comprising a polymeric unit of the formula 6a, 6b, 6c, or mixtures thereof is outlined in Reaction Scheme 1, where R$_1$, R$_2$, R$_3$, R$_4$ and R$_5$ are those defined above. Briefly, the photoresist polymer comprising polymeric unit of formula 6a, 6b, 6c, or mixtures thereof is prepared by:

(a) polymerizing the compound of formula 1a, preferably in the presence of a polymerization initiator, to obtain a dihydroxy polymer comprising a dihydroxy polymeric unit of formula 7a, 7b, 7c, or mixtures thereof; and (b) reacting the dihydroxy polymer with a protecting group precursor to produce a protected dihydroxy polymer, where at least a portion of the hydroxy groups in the dihydroxy polymer is substituted with an acid labile protecting group.

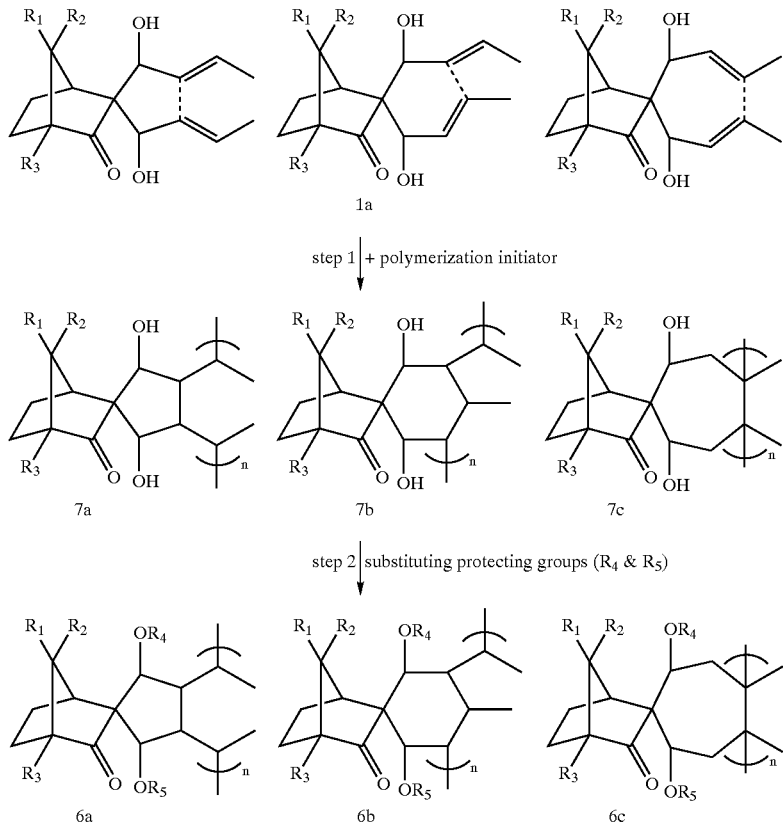

Preferably, the dihydroxy polymer is reacted with a protecting group precursor in the presence of an acid catalyst or a base catalyst to produce the protected dihydroxy polymer.

In another embodiment of the present invention, a method for producing a polymer comprising a polymeric unit of the formula 6d, 6e, 6f, or mixtures thereof is generally outlined in Reaction Scheme 2 below, where $R_1$, $R_2$, $R_3$, $R_4$, $R_5$, and $R_6$ are those defined above. Briefly, the method comprises the steps of:

(a) reducing a dihydroxy polymer comprising a dihydroxy polymeric unit of formula 7a, 7b, 7c, or mixtures thereof to produce a trihydroxy polymer comprising a trihydroxy polymeric unit of formula 8a, 8b, 8c, or mixtures thereof, respectively; and (b) reacting the trihydroxy polymer with a protecting group precursor to produce a protected trihydroxy polymer, where at least a portion of the hydroxy groups in the trihydroxy polymer is substituted with an acid labile protecting group.

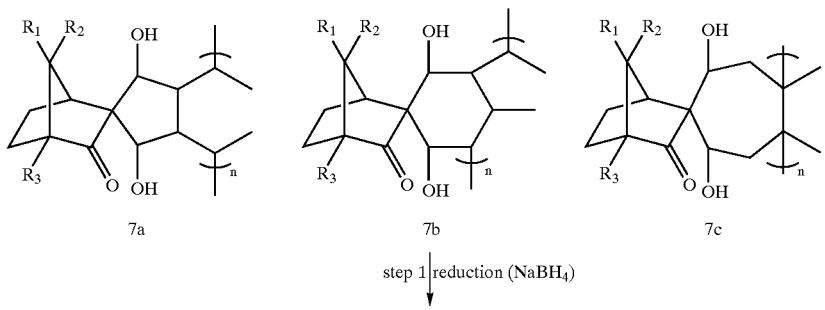

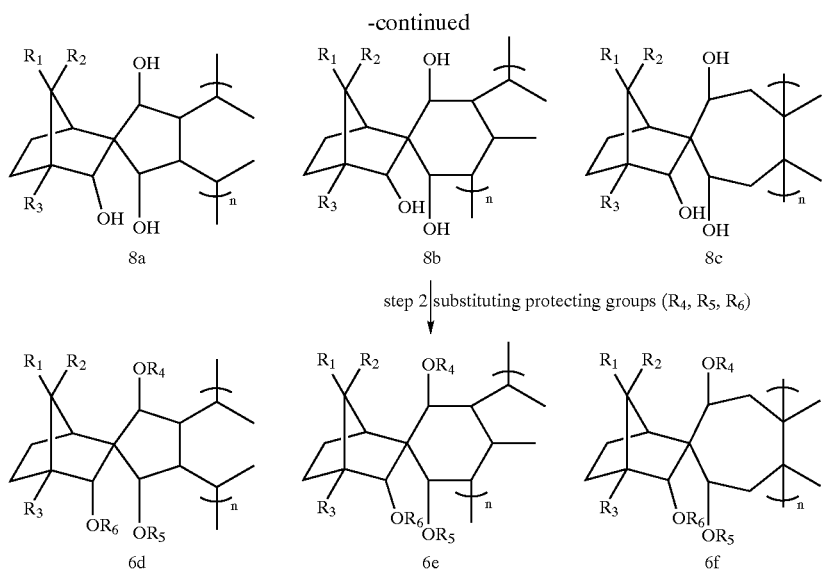

Preferably, the trihydroxy polymer is reacted with a protecting group precursor in the presence of an acid catalyst or a base catalyst to produce the protected trihydroxy polymer.

Yet another embodiment of the present invention provides a method of preparing a polymer comprising a polymeric unit of the formula 6d, 6e, 6f, or mixtures thereof as shown in Reaction Scheme 3, where $R_1$, $R_2$, $R_3$, $R_4$, $R_5$, and $R_6$ are those defined above. Briefly, this method includes the steps of:

(a) reducing a compound of the formula 1b to produce a trihydroxy compound of formula 9;

(b) polymerizing the trihydroxy compound of formula 9, preferably in the presence of a polymerization initiator, to produce a trihydroxy polymer comprising a trihydroxy polymeric unit of formula 8a, 8b, 8c, or mixtures thereof; and (c) reacting the trihydroxy polymer with a protecting group precursor to produce the a protected trihydroxy polymer comprising a protected trihydroxy polymeric unit of the formula 6d, 6e, 6f, or mixtures thereof, respectively, where at least a portion of the hydroxy groups in the trihydroxy polymer is substituted with an acid labile protecting group.

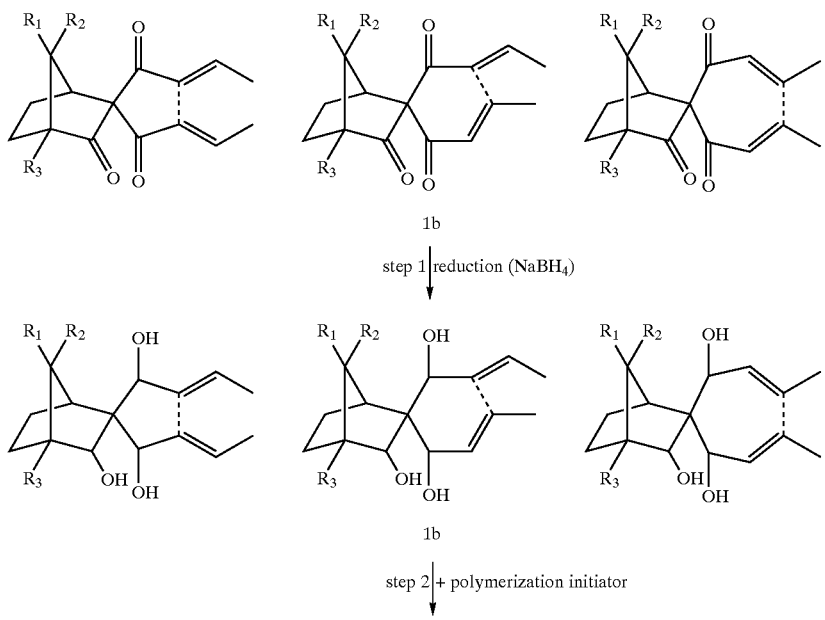

Reaction Scheme 3

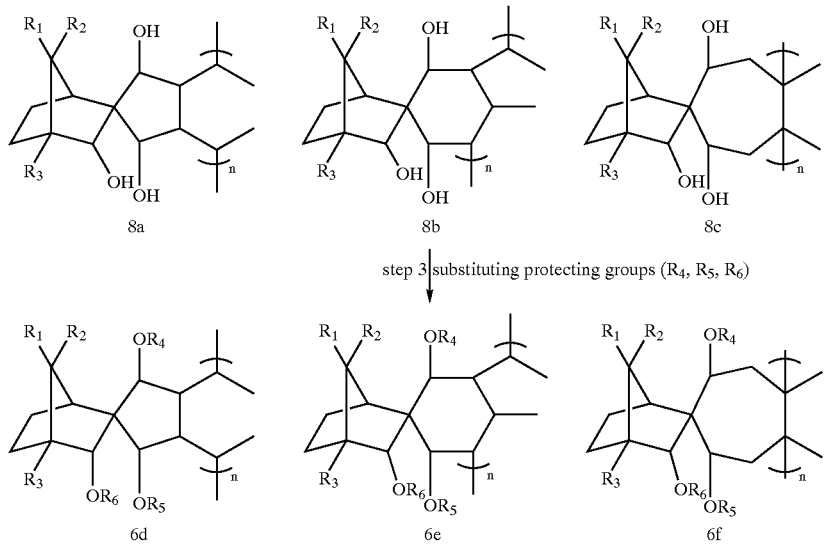

Preferably, the trihydroxy polymer is reacted with a protecting group precursor in the presence of an acid catalyst or a base catalyst to produce the protected trihydroxy polymer.

As shown in Reaction Schemes 1 to 3, when the compound of formula 1a and/or 1b is polymerized in the presence of a polymerization initiator, three types of polymeric units can be produced depending on the site of the polymerization reaction. Typically, all three types of polymeric units are present in the polymer that is produced. That is, a polymer whose main chain (i.e., polymer backbone) consists of the three types of polymeric units is obtained.

Exemplary polymerization initiators include any conventional radical polymerization initiators such as 2,2'-azobisisobutyronitrile (AIBN), benzoylperoxide, acetylperoxide, laurylperoxide and tert-butyloxide.

When a dihydroxy polymer comprising a dihydroxy polymeric unit of formula 7a, 7b, 7c, or mixtures thereof, or a trihydroxy polymer comprising a trihydroxy polymeric unit of formula 8a, 8b, 8c, or mixtures thereof is reacted with a protecting group precursor, at least a portion of the hydroxy groups becomes substituted with an acid labile protecting group, thereby producing a photoresist polymer comprising a polymeric unit 6a, 6b, 6c, or mixtures thereof, and a photoresist polymer comprising a polymeric unit 6d, 6e, 6f, or mixtures thereof, respectively.

The acid catalyst is preferably selected from the group consisting of sulfuric acid, hydrochloric acid, nitric acid and acetic acid, and the base catalyst is preferably selected from the group consisting of NaH, $CaH_2$, $K_2CO_3$, $Na_2CO_3$ and $NaHCO_3$.

Preferably, as shown in the Reaction Scheme 3, the reduction of the carbonyl group is achieved using sodium borohydride ($NaBH_4$) as the reducing agent.

Preferably, the protecting group precursor ("D") (→deletion) is selected from compounds of formulas 10–23, which corresponds to 3,4-dihydro-2H-pyran, 2-methyl-3,4-dihydro-2H-pyran, 2,3-dihydrofuran, 5-methyl-2,3-dihydrofuran, 1-methoxyprop-1-ene, 2-methoxyprop-1-ene, 1-ethoxyprop-1-ene, 2-ethoxyprop-1-ene, methyl vinyl ether, ethyl vinyl ether, tert-butyl vinyl ether, isobutyl vinyl ether, di-tert-butyl dicarbonate, and 2-acetylmenth-1-ene, respectively:

 10

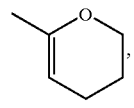 11

 12

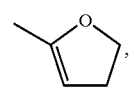 13

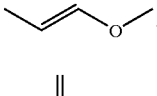 14

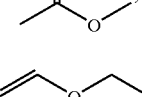 15

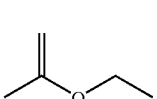 16

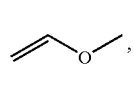 17

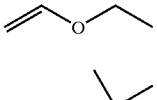 18

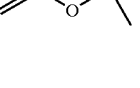 19

 20

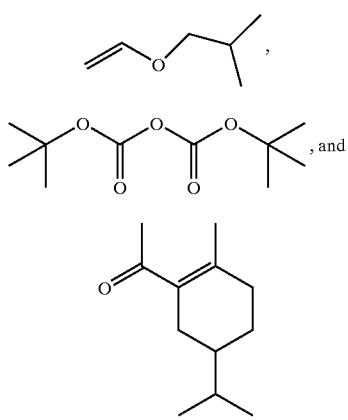

The amount of hydroxy group which is protected can be easily controlled by adjusting the amount of protecting group precursor of formulas 10 to 23 that is added to the reaction mixture. In one particular embodiment, the amount of the acid labile protecting group present in the photoresist polymer is in the range of from about 10% to about 90% of the total hydroxy groups.

The polymer obtained from polymerization in the above process can be crystallized and purified by using a solution selected from the group consisting of petroleum ether; diethyl ether; lower alcohol such as methanol, ethanol and isopropanol; water; and mixture thereof. And exemplary solvents suitable for polymerization include benzene, THF, dimethylformamide, dimethylsulfoxide, dioxane, toluene and xylene.

The photoresist polymer of the present invention comprises a suitable amount of the hydroxyl groups, and thus can be dissolved in an alkaline solvent. Therefore, 2.38 wt % or 2.6 wt % aqueous TMAH solution can be utilized as a developing solution. Moreover, the hydroxyl groups provide an excellent adhesiveness of the photoresist polymer to the wafer.

Photoresist resins of the present invention include a hydroxy protecting group, which reduces the solubility in a developing solution. However, when at least a portion of the hydroxy protecting group is removed, e.g., in the presence of an acid that is generated from a photoacid generator, the photoresist resin becomes relatively more soluble in the developing solution. As a result, photosensitivity at the exposed and unexposed sections is excellent (i.e., the exposed and unexposed sections have a significantly different solubility), and a contrast ratio is increased, thereby producing a superior pattern formation. Furthermore, the resolution is significantly increased, and the minute pattern formation can be achieved using a low exposure energy, thereby enhancing the sensitivity. In addition, photoresist resins of the present invention have an alicyclic unit (i.e., polymer backbone) which results in an excellent durability, etching resistance and reproducibility.

The present invention also provides a photoresist composition comprising the photoresist polymer described above, an organic solvent and a photoacid generator.

As described above, polymers of the present invention comprise one or more polymeric units selected from the group consisting of polymeric units of formulas 6a to 6f. In addition to these polymeric units, polymers of the present invention can further comprise one or more polymeric units which are derived from the group consisting of norbornylene and maleic anhydride.

Preferred photoacid generators include sulfide or onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. The photoacid generator is used in an amount of 0.05 to 10 wt % of the photoresist resin employed. It has been found that when the photoacid generator is used in the amount less than about 0.05%, it lowers photosensitivity of the PR composition, and when the photoacid generator is used in the amount greater than about 10%, it results in poor patterning due to its large absorption of light.

Exemplary organic solvents suitable in PR compositions of the present invention include methyl 3-methoxypropionate, ethyl 3-ethoxypropionate, propylene glycol methyl ether acetate, cyclohexanone, cyclopentanone, 2-heptanone and (2-methoxy)ethyl acetate. The amount of solvent used is preferably in the range of from about 200% to about 1000% by weight of the PR resin. This ratio has been found to be particularly useful in obtaining a photoresist layer of desirable thickness when coated on to a suitable substrate such as a silicon wafer in production of a semiconductor element. In particular, it has been found by the present inventors that when the amount of organic solvent is about 600% by weight of the PR copolymer, a PR layer having 0.5 μm of thickness can be obtained.

The present invention also provides a process for forming a photoresist pattern comprising the steps of:

(a) coating a photoresist composition described above on a substrate of semiconductor device to form a photoresist film;

(b) exposing the photoresist film to light using a light source; and (c) developing the exposed photoresist film.

The process for forming the photoresist pattern can further include a baking step before and/or after the exposure step (b). Preferably, the baking step is performed at temperature in the range of from about 70 to about 200° C.

Exemplary light sources which are useful for forming the PR pattern include ArF, KrF, EUV, VUV, E-beam, X-ray or ion beam. Preferably, the irradiation energy is in the range of from about 1 mJ/cm² to about 50 mJ/cm².

The developing step (c) can be carried out using an alkali developing solution or distilled water. The alkali developing solution is preferably an aqueous solution comprising from about 0.01 to about 5 wt % of TMAH.

Furthermore, the present invention provides a semiconductor device, which is manufactured using the photoresist composition described above.

Additional objects, advantages, and novel features of this invention will become apparent to those skilled in the art upon examination of the following examples thereof, which are not intended to be limiting.

I. PREPARATION OF MONOMERS

EXAMPLE 1

Preparation of Compound of Chemical Formula 1c

To 100 ml of anhydrous tetrahydrofuran (THF) was added 0.1 mole of norcamphor, and the resulting solution was cooled to −20° C. Thereafter, 0.1 mole of n-BuLi (2.5 M solution dissolved in hexane) was added, and the reaction mixture was stirred for 20 to 30 minutes, after which 0.1 mole of crotonaldehyde was slowly added, and the resulting reaction mixture was stirred for 24 hours at room temperature. The reaction mixture was then filtered, and the filtrate was concentrated by distillation. The residue was diluted with water and extracted with ethyl acetate. Ethyl acetate layer was dried over anhydrous $MgSO_4$, filtered and distilled to yield a crude compound of formula 3, where $R_1$, $R_2$ and $R_3$ are hydrogen. The crude compound was dissolved in 100 ml of THF and 0.2 mole of n-BuLi was added. The resulting mixture was stirred at $-20°$ C. for 20 minutes, and 0.1 mole of crotonaldehyde was added. And the resulting mixture was stirred for 5 hours at room temperature. The reaction mixture was filtered, and the filtrate was distilled. The residue was diluted with water and extracted with ethyl acetate. The ethyl acetate layer was dried over anhydrous $MgSO_4$, filtered and distilled to provide the compound of formula 1c (yield: 23 g).

EXAMPLE 2

Preparation of Compound of Chemical Formula 1d

The procedure of Example 1 is repeated using camphor, instead of norcamphor, to provide the compound of formula 1d.

EXAMPLE 3

Preparation of Compound of Chemical Formula 1e

To 100 ml of anhydrous tetrahydrofuran (THF) was added 0.1 mole of camphor, and the resulting mixture was cooled to $-20°$ C., and 0.1 mole of n-BuLi (2.5 M solution dissolved in hexane) was added. The reaction mixture was stirred for 20 to 30 minutes, and 0.1 mole of crotonic anhydride was slowly added. The resulting mixture was stirred for 24 hours at room temperature, and concentrated by distillation. Acetone was added to the concentrate, filtered, and the filtrate was concentrated via distillation to provide a crude intermediate material. The intermediate material and 0.1 mole of NaH were combined in 100 ml of anhydrous THF, stirred for 10 minutes, and 0.1 mole of crotonic anhydride was added. The resulting mixture was stirred for 10 hours at room temperature, and concentrated by distillation. The residue was diluted with 200 ml of 0.1 N aqueous HCl and 300 ml of ethyl acetate. The ethyl acetate layer was separated, dried over anhydrous $MgSO_4$, filtered and concentrated by distillation to provide the compound of formula 1e (yield: 18 g).

EXAMPLE 4

Preparation of Compound of Chemical Formula 1f

The procedure of Example 3 was repeated using norcamphor instead of camphor, to provide the compound of formula $1f^1$.

II. PREPARATION OF POLYMERS

A. Method by Reaction Scheme 1

EXAMPLE 5

Preparation of Polymers Having tert-Butoxycarbonyl Group as Protecting Group (Step 1)

The monomer obtained from Example 1 and 0.30 g of AIBN were dissolved in 25 ml of benzene, and the mixture was stirred at $69°$ C. for 10 hours. The produced material was crystallized and purified in petroleum ether to provide a solid. The solid was filtered and dried to prepare a polymer comprising polymeric units of formulas 7a, 7b and 7c (yield: 18 g).

(Step 2)

To 15 ml of anhydrous THF was added 10 g of the polymer obtained from (step 1), 7 g of di-tert-butyl dicarbonate and 0.01 mg of sulfuric acid. The resulting mixture was stirred for 5 hours and precipitated in methanol/water (10/1) solution to provide a photoresist polymer having tert-butoxycarbonyl protecting group on at least a portion of the hydroxyl groups (yield: 11 g).

EXAMPLE 6

Preparation of Polymers Having Tetrahydropyranyl Group as Protecting Group

To 100 ml of anhydrous THF was added 10 g of the polymer prepared in Example 5 (step 1), 3 g of 3,4-dihydro-2H-pyran and 0.01 mg of sulfuric acid, and the mixture was stirred for 3 hours at 20 to $25°$ C. and precipitated in methanol/water (10/1) solution to provide a photoresist polymer having tetrahydropyranyl protecting group on at least a portion of the hydroxyl groups (yield: 9 g).

EXAMPLE 7

Preparation of Polymers Having Tetrahydrofuranyl Group as Protecting Group

The procedure of Example 6 was repeated using 2,3-dihydrofuran instead of 3,4-dihydro-2H-pyran to provide a photoresist polymer having tetrahydrofuranyl protecting group on at least a portion of the hydroxyl groups (yield: 8.8 g).

EXAMPLE 8

Preparation of Polymers Having Methoxyethyl Group as Protecting Group

The procedure of Example 6 was repeated using methylvinylether instead of 3,4-dihydro-2H-pyran to provide a photoresist polymer having methoxyethyl protecting group on at least a portion of the hydroxyl groups (yield: 9.5 g).

EXAMPLE 9

Preparation of Polymers Having tert-Butoxyethyl Group as Protecting Group

The procedure of Example 6 was repeated using tert-butylvinylether group instead of 3,4dihydro-2H-pyran to provide a photoresist polymer having tert-butoxyethyl protecting group on at least a portion of the hydroxyl groups (yield: 11 g)

EXAMPLE 10

Preparation of Polymers Having tert-Butoxycarbonyl Group as Protecting Group

The procedure of Example 5 was repeated using the monomer of Example 2 instead of the monomer of Example 1 to provide a photoresist polymer having tert-butoxycarbonyl protecting group on at least a portion of the hydroxyl groups (yield: 11 g).

EXAMPLE 11

Preparation of Polymers Having Tetrahydropyranyl Group as Protecting Group

The procedure of Example 6 was repeated using the monomer of Example 2 instead of the monomer of Example 1 to provide a photoresist polymer having tetrahydropyranyl protecting group on at least a portion of the hydroxyl groups (yield: 9 g).

EXAMPLE 12

Preparation of Polymers Having Tetrahydrofuranyl Group as Protecting Group

The procedure of Example 7 was repeated using the monomer of Example 2 instead of the monomer of Example 1 to provide a photoresist polymer having tetrahydrofuranyl protecting group on at least a portion of the hydroxyl groups (yield: 8.8 g).

EXAMPLE 13

Preparation of Polymers Having Methoxyethyl Group as Protecting Group

The procedure of Example 8 was repeated using the monomer of Example 2 instead of the monomer of Example 1 to provide a photoresist polymer having methoxyethyl protecting group on at least a portion of the hydroxyl groups (yield: 9.5 g).

EXAMPLE 14

Preparation of Polymers Having tert-Butoxyethyl Group as Protecting Group

The procedure of Example 9 was repeated using the monomer of Example 2 instead of the monomer of Example 1 to provide a photoresist polymer having tert-butoxyethyl protecting group on at least a portion of the hydroxyl groups (yield: 9 g).

B. Method by Reaction Scheme 2

EXAMPLE 15

Preparation of Polymers having tert-Butoxycarbonyl Group as Protecting Group
(Step 1)
The monomer obtained from Example 5 (step 1) and 0.30 g of AIBN were added to 100 ml of ethanol. To this solution was slowly added 3.78 g of $NaBH_4$ and the resulting mixture was stirred at 50° C. for 10 hours. After which the solution was concentrated by distillation. The residue was diluted with 100 ml of acetone, and concentrated again by distillation. The resulting residue was diluted with 200 ml of 0.1 N HCl and 500 ml of chloroform. The organic layer was separated, dried over $MgSO_4$ and distilled to obtain a crude polymer having polymeric units of formulas 8a, 8b and 8c, where $R_1$, $R_2$ and $R_3$ are hydrogens. This crude polymer was washed with petroleum ether, filtered and dried over to obtain a pure polymer comprising polymeric units 8a, 8b, and 8c (yield: 7.5 g).
(Step 2)
To 100 ml of anhydrous THF was added 10 g of the polymer obtained from (step 1), 7 g of di-tert-butyl dicarbonate and 0.01 mg of sulfuric acid, and the mixture was stirred for 3 hours at 20 to 25° C. The resulting product was precipitated in methanol/water (10/1) solution to obtain a photoresist polymer having tert-butoxycarbonyl protecting group on at least a portion of the hydroxyl groups (yield: 9 g).

EXAMPLE 16

Preparation of Polymers Having Tetrahydropyranyl Group as Protecting Group

To 100 ml of anhydrous THF was added 10 g of the polymer prepared in Example 15 (step 1), 3 g of 3,4-dihydro-2H-pyran and 0.01 mg of sulfuric acid, and the mixture was stirred for 3 hours at 20 to 25° C. The resulting product was precipitated in methanol/water (10/1) solution to provide a photoresist polymer having tetrahydropyranyl protecting group on at least a portion of the hydroxyl groups (yield: 9 g).

EXAMPLE 17

Preparation of Polymers Having Tetrahydrofuranyl Group as Protecting Group

The procedure of Example 16 was repeated using 2,3-dihydrofuran instead of 3,4-dihydro-2H-pyran to obtain a photoresist polymer having tetrahydrofuranyl protecting group on at least a portion of the hydroxyl groups (yield: 8.8 g).

EXAMPLE 18

Preparation of Polymers Having Methoxyethyl Group as Protecting Ground

The procedure of Example 16 was repeated using methylvinylether instead of 3,4-dihydro-2H-pyran to obtain a photoresist polymer having methoxyethyl protecting group on at least a portion of the hydroxyl groups (yield: 9.5 g).

EXAMPLE 19

Preparation of Polymers Having tert-Butoxyethyl Group as Protecting Group

The procedure of Example 16 was repeated using tert-butylvinylether group instead of 3,4-dihydro-2H-pyran to obtain a photoresist polymer having tert-butoxyethyl protecting group on at least a portion of the hydroxyl groups (yield: 11 g).

EXAMPLE 20

Preparation of Polymers Having tert-Butoxycarbonyl Group as Protecting Group
(Step 1)
To 100 ml of ethanol was added 8 g of the polymer comprising polymeric units of formulas 7a, 7b and 7c obtained from Example 10, and 3.78 g of $NaBH_4$ was slowly added. The resulting mixture was stirred at 50° C. for 10 hours, and concentrated by distillation. The residue was diluted with 100 ml of acetone, and again concentrated by distillation. The residue was diluted with 200 ml of 0.1 N HCl and 500 ml of chloroform. The organic layer was separated, dried over $MgSO_4$ and distilled to obtain a crude polymer comprising polymeric units of formulas 8a, 8b, and 8c, where $R_1$, $R_2$, and $R_3$ are methyl groups. This crude polymer was washed with petroleum ether, filtered and dried to obtain a polymer comprising polymeric units of formulas 8a, 8b and 8c (yield: 7.5 g).
(Step 2)
To 100 ml of anhydrous THF was added 10 g of the polymer obtained from (step 1), 7 g of di-tert-butyl dicarbonate and 0.01 mg of sulfuric acid, and the mixture was stirred for 3 hours at 20 to 25° C. The product was precipitated in methanol/water (10/1) solution to provide a photoresist polymer having tert-butoxycarbonyl protecting group on at least a portion of the hydroxyl groups (yield: 11 g).

EXAMPLE 21

Preparation of Polymers Having Tetrahydropyranyl Group as Protecting Group

To 100 ml of anhydrous THF was added 10 g of the polymer prepared in Example 20 (step 1), 3 g of 3,4- dihydro-2H-pyran and 0.01 mg of sulfuric acid, and the mixture was stirred for 3 hours at 20 to 25° C. The product was precipitated in methanol/water (10/1) solution to provide a photoresist polymer having tetrahydropyranyl protecting group on at least a portion of the hydroxyl groups (yield: 9 g).

EXAMPLE 22

Preparation of Polymers Having Tetrahydrofuranyl Group as Protecting Group

The procedure of Example 21 was repeated using 2,3-dihydrofuran instead of 3,4-dihydro-2H-pyran to obtain a photoresist polymer having tetrahydrofuranyl protecting group on at least a portion of the hydroxyl groups (yield: 8.8 g).

EXAMPLE 23

Preparation of Polymers Having Methoxyethyl Group as Protecting Group

The procedure of Example 21 was repeated using methylvinylether instead of 3,4-dihydro-2H-pyran to obtain a photoresist polymer having methoxyethyl group protecting group on at least a portion of the hydroxyl groups (yield: 9.5 g).

EXAMPLE 24

Preparation of Polymers Having tert-Butoxyethyl Group as Protecting Group

The procedure of Example 21 was repeated using tert-butylvinylether group instead of 3,4-dihydro-2H-pyran to obtain a photoresist polymer having tert-butoxyethyl protecting group on at least a portion of the hydroxyl groups (yield: 9 g).

C. Method by Reaction Scheme 3

EXAMPLE 25

Preparation of Polymers Having tert-Butoxycarbonyl Group as Protecting Group (Step 1)
To 100 ml of ethanol was added 10 g of the compound obtained from Example 3, and 4 g of $NaBH_4$ was slowly added to the mixture, and the resulting mixture was stirred for 20 hours, after which 100 ml of acetone was added and stirred for 30 minutes. The resulting solution was concentrated by distillation, and the concentrate was diluted with 200 ml of 0.1 N HCl and extracted with 600 ml (200 ml×3) of ethyl acetate. The organic layer was dried over $MgSO_4$, and concentrated by distillation to obtain a compound of formula 9, where $R_1$, $R_2$, and $R_3$ are methyl groups (yield: 9.1 g).

(Step 2)
To 50 ml of THF was added 5 g of the compound obtained from step 1 and 0.10 g of AIBN. The resulting mixture was stirred at 67° C. for 10 hours. The resulting product of the reaction was crystallized and purified in petroleum ether to obtain a solid. The solid was filtered and dried to provide a polymer comprising polymeric units of formulas 8a, 8b, and 8c (yield: 4.4 g).

(Step 3)
To 100 ml of anhydrous THE was added 10 g of the polymer obtained from (step 2) and 7 g of di-tert-butyl dicarbonate, and the mixture was stirred for 10 hours at 20 to 25° C. The product of the reaction was precipitated in methanol/water (10/1) solution to obtain a photoresist polymer having tert-butoxycarbonyl protecting group on at least a portion of the hydroxyl groups (yield: 11 g).

EXAMPLE 26

Preparation of Polymers Having Tetrahydropyranyl Group as Protecting Group

To 100 ml of anhydrous THF was added 10 g of the polymer prepared by Example 25 (step 2), 3 g of 3,4-dihydro-2H-pyran and 0.01 mg of sulfuric acid. The resulting mixture was stirred for 3 hours at 20 to 25° C. The product was precipitated in methanol/water (10/1) solution to obtain a photoresist polymer having tetrahydropyranyl protecting group on at least a portion of the hydroxyl groups (yield : 9 g).

EXAMPLE 27

Preparation of Polymers Having Tetrahydrofuranyl Group as Protecting Group

The procedure of Example 26 was repeated using 2,3-dihydrofuran instead of 3,4-dihydro-2H-pyran to obtain a photoresist polymer having tetrahydrofuranyl protecting group on at least a portion of the hydroxyl groups (yield: 8.8 g).

EXAMPLE 28

Preparation of Polymers Having Methoxyethyl Group as Protecting Group

The procedure of Example 26 was repeated using methylvinylether instead of 3,4-dihydro-2H-pyran to obtain a photoresist polymer having methoxyethyl protecting group on at least a portion of the hydroxyl groups (yield: 9.5 g).

EXAMPLE 29

Preparation of Polymers Having tert-Butoxyethyl Group as Protecting Group

The procedure of Example 26 was repeated using tert-butylvinylether group instead of 3,4-dihydro-2H-pyran to obtain a photoresist polymer having tert-butoxyethyl protecting group on at least a portion of the hydroxyl groups (yield: 11 g).

EXAMPLE 30

Preparation of Polymers Having tert-Butoxycarbonyl Group as Protecting Group

The procedure of Example 25 was repeated using the monomer of Example 4 instead of the monomer of Example 3 to obtain a photoresist polymer having tert-butoxycarbonyl protecting group on at least a portion of the hydroxyl groups (yield: 11 g).

EXAMPLE 31

Preparation of Polymers Having Tetrahydropyranyl Group as Protecting Group

The procedure of Example 26 was repeated using the monomer of Example 4 instead of the monomer of Example 3 to obtain a photoresist polymer having tetrahydropyranyl protecting group on at least a portion of the hydroxyl groups (yield: 9 g).

EXAMPLE 32

Preparation of Polymers Having Tetrahydrofuranyl Group as Protecting Group

The procedure of Example 27 was repeated using the monomer of Example 4 instead of the monomer of Example 3 to obtain a photoresist polymer having tetrahydrofuranyl protecting group on at least a portion of the hydroxyl groups (yield: 8.8 g).

EXAMPLE 33

Preparation of Polymers Having Methoxyethyl Group as Protecting Group

The procedure of Example 28 was repeated using the monomer of Example 4 instead of the monomer of Example 3 to obtain a photoresist polymer having methoxyethyl protecting group on at least a portion of the hydroxyl groups (yield: 9.5 g).

EXAMPLE 34

Preparation of Polymers Having tert-Butoxyethyl Group as Protecting Group

The procedure of Example 29 was repeated using the monomer of Example 4 instead of the monomer of Example 3 to obtain a photoresist polymer having tert-butoxyethyl protecting group on at least a portion of the hydroxyl groups (yield: 9 g).

It should be appreciated that while theoretically each of the polymers obtained from Examples 15 to 24 may be identical with the polymers obtained from Examples 25 to 34, respectively, the substitution ratio of the protecting group may be different from one another since the preparation methods between Examples 15 to 24 and Examples 25 to 34 are different.

III. PREPARATION OF PHOTORESIST COMPOSITION AND FORMATION OF PATTERN

EXAMPLE 35

The polymer obtained from Example 5 (10 g) and triphenylsulfonium triflate (0.12 g) were dissolved in ethyl 3-ethoxypropionate (45 g), and the resulting mixture was filtered through a 0.20 μm filter to prepare a photoresist composition. The photoresist composition was spin-coated on a silicon wafer, and soft-baked at 110° C. for 90 seconds. Thereafter, the photoresist was exposed to light generated by an ArF laser exposer, and then post-baked at 110° C. for 90 seconds. When the post-baking was completed, it was developed in 2.38 wt % aqueous TMAH solution for 40 seconds to obtain a 0.12 μm L/S pattern.

EXAMPLE 36

The procedure of Example 35 was repeated except that the polymer obtained from Example 6 (10 g) was used instead of the polymer obtained from Example 5. By using this photoresist composition, 0.13 μm L/S pattern was obtained.

EXAMPLE 37

The procedure of Example 35 was repeated except that the polymer obtained from Example 7 (10 g) was used instead of the polymer obtained from Example 5. By using this photoresist composition, 0.13 μm L/S pattern was obtained.

EXAMPLE 38

The procedure of Example 35 was repeated except that the polymer obtained from Example 8 (10 g) was used instead of the polymer obtained from Example 5. By using this photoresist composition, 0.14 μm L/S pattern was obtained.

EXAMPLE 39

The procedure of Example 35 was repeated except that the polymer obtained from Example 9 (10 g) was used instead of the polymer obtained from Example 5. By using this photoresist composition, 0.12 μm L/S pattern was obtained.

EXAMPLE 40

The procedure of Example 35 was repeated except that the polymer obtained from Example 10 (10 g) was used instead of the polymer obtained from Example 5. By using this photoresist composition, 0.12 μm L/S pattern was obtained.

EXAMPLE 41

The procedure of Example 35 was repeated except that the polymer obtained from Example 11 (10 g) was used instead of the polymer obtained from Example 5. By using this photoresist composition, 0.13 μm L/S pattern was 6obtained.

EXAMPLE 42

The procedure of Example 35 was repeated except that the polymer obtained from Example 12 (10 g) was used instead of the polymer obtained from Example 5. By using this photoresist composition, 0.13 μm L/S pattern was obtained.

EXAMPLE 43

The procedure of Example 35 was repeated except that the polymer obtained from Example 13 (10 g) was used instead of the polymer obtained from Example 5. By using this photoresist composition, 0.14 μm L/S pattern was obtained.

EXAMPLE 44

The procedure of Example 35 was repeated except that the polymer obtained from Example 14 (10 g) was used instead of the polymer obtained from Example 5. By using this photoresist composition, 0.12 μm L/S pattern was obtained.

EXAMPLE 45

The procedure of Example 35 was repeated except that the polymer obtained from Example 25 (10 g) was used instead of the polymer obtained from Example 5. By using this photoresist composition, 0.12 μm L/S pattern was obtained (see FIG. 1).

EXAMPLE 46

Figure 2:
FIG. 2 shows a photoresist pattern obtained in Example 46.
Figure 3:
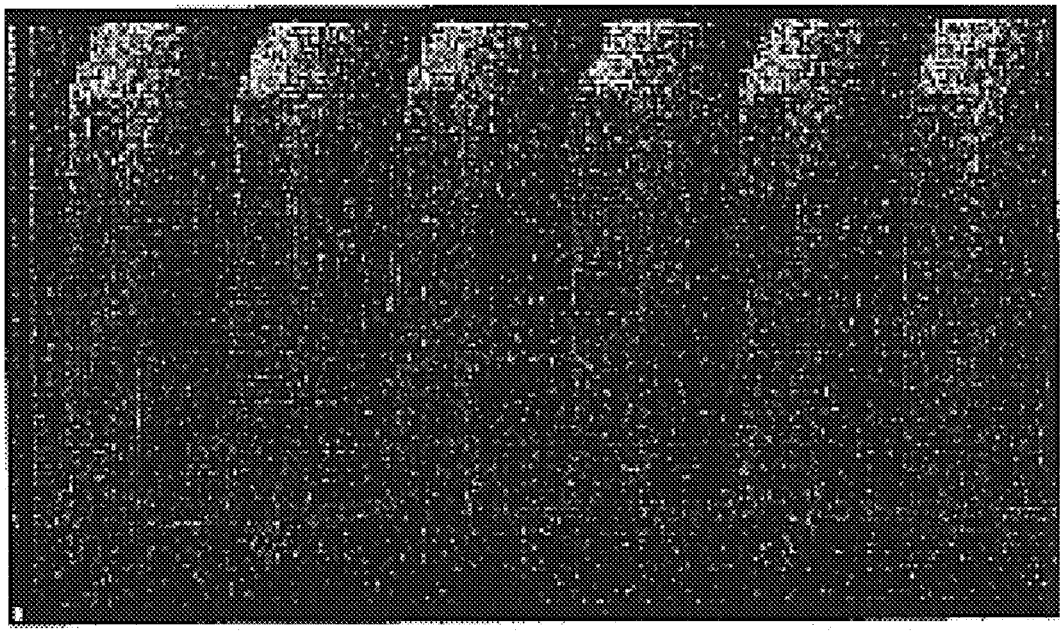
FIG. 3 shows a photoresist pattern obtained in Example 48.

The procedure of Example 35 was repeated except that the polymer obtained from Example 26 (10 g) was used instead of the polymer obtained from Example 5. By using this photoresist composition, 0.13 μm L/S pattern was obtained (see FIG. 2).

EXAMPLE 47

The procedure of Example 35 was repeated except that the polymer obtained from Example 27 (10 g) was used instead of the polymer obtained from Example 5. By using this photoresist composition, 0.13 μm L/S pattern was obtained.

EXAMPLE 48

The procedure of Example 35 was repeated except that the polymer obtained from Example 28 (10 g) was used

EXAMPLE 49

The procedure of Example 35 was repeated except that the polymer obtained from Example 29 (10 g) was used instead of the polymer obtained from Example 5. By using this photoresist composition, 0.12 μm L/S pattern was obtained.

EXAMPLE 50

The procedure of Example 35 was repeated except that the polymer obtained from Example 30 (10 g) was used instead of the polymer obtained from Example 5. By using this photoresist composition, 0.12 μm L/S pattern was obtained.

EXAMPLE 51

The procedure of Example 35 was repeated except that the polymer obtained from Example 31 (10 g) was used instead of the polymer obtained from Example 5. By using this photoresist composition, 0.13 μm L/S pattern was obtained.

EXAMPLE 52

The procedure of Example 35 was repeated except that the polymer obtained from Example 32 (10 g) was used instead of the polymer obtained from Example 5. By using this photoresist composition, 0.13μm L/S pattern was obtained.

EXAMPLE 53

Figure 4:
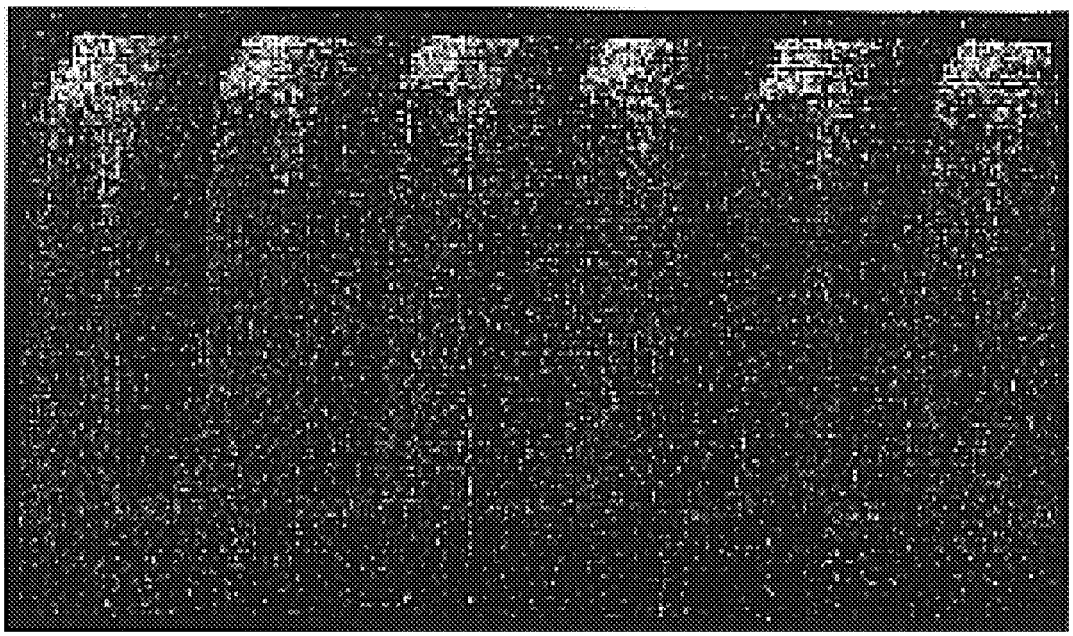
FIG. 4 shows a photoresist pattern obtained in Example 53.

The procedure of Example 35 was repeated except that the polymer obtained from Example 33 (10 g) was used instead of the polymer obtained from Example 5. By using this photoresist composition, 0.14 μm L/S pattern was obtained (see FIG. 4).

EXAMPLE 54

The procedure of Example 35 was repeated except that the polymer obtained from Example 34 (10 g) was used instead of the polymer obtained from Example 5. By using this photoresist composition, 0.12 μm L/S pattern was obtained.

As discussed above, in a photolithography process using KrF, ArF, VUV, EUV and E-beam, especially ultrashort wave light sources below 250 nm, the photoresist monomers of the present invention and the photoresist polymers derived from the same can form the photoresist pattern having excellent resolution, and thus are suitable for the formation of the ultrafine pattern of 4G and 16G DRAMs as well as the DRAM below 1G. Moreover, the photoresist monomers and polymers derived from the same have an excellent durability, etching resistance, reproducibility and resolution, which results in fabrication of semiconductor devices having good reliability.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist monomer selected from the group consisting of a dihydroxy compound of the formula:

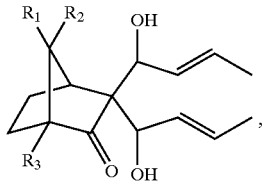

and a tricarbonyl compound of the formula:

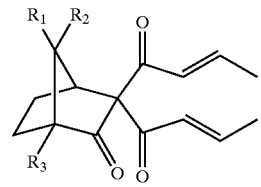

wherein, each of $R_1$, $R_2$ and $R_3$ is independently H, or substituted or unsubstituted linear or branched ($C_1$–$C_4$) alkyl.

2. The photoresist monomer according to claim 1, wherein $R_1$, $R_2$, and $R_3$ are H or methyl.

* * * * *